United States Patent [19]

Miwa et al.

[11] Patent Number: 6,015,596

[45] Date of Patent: Jan. 18, 2000

[54] FLUORINE-CONTAINING SILICON NETWORK POLYMER, INSULATING COATING THEREOF, AND ELECTRONIC DEVICES THEREWITH

[75] Inventors: Takao Miwa, Hitachinaka; Akira Watanabe, Sendai; Osamu Ito, Sendai; Minoru Matsuda, Sendai, all of Japan

[73] Assignee: Hitachi, Ltd., Tokyo, Japan

[21] Appl. No.: 08/945,472

[22] PCT Filed: Apr. 24, 1996

[86] PCT No.: PCT/JP96/01107

§ 371 Date: Oct. 27, 1997

§ 102(e) Date: Oct. 27, 1997

[87] PCT Pub. No.: WO96/34034

PCT Pub. Date: Oct. 31, 1996

[30] Foreign Application Priority Data

Apr. 25, 1995 [JP] Japan ..................................... 7-099228
Jul. 18, 1995 [JP] Japan ..................................... 7-181416

[51] Int. Cl.$^7$ ........................................................ C08J 7/18
[52] U.S. Cl. .......................... 427/489; 205/414; 205/420; 528/42; 528/10; 528/25; 528/39; 501/88; 522/148; 427/376.2

[58] Field of Search ..................................... 205/414, 420; 528/25, 39, 10, 42; 501/88; 522/148; 427/489, 376.2

[56] References Cited

U.S. PATENT DOCUMENTS

| | | | |
|---|---|---|---|
| 4,808,685 | 2/1989 | Bortolin | 528/10 |
| 4,826,892 | 5/1989 | Shimada et al. | 528/10 |
| 4,841,083 | 6/1989 | Nagai et al. | 528/10 |

OTHER PUBLICATIONS

Concise Encyclopedia of Polymer Science and Engineering (1990 ed). p. 644.

*Primary Examiner*—Melvyn I. Marquis
*Attorney, Agent, or Firm*—Antonelli, Terry, Stout & Kraus, LLP

[57] ABSTRACT

A fluorosilicon network polymer prepared by the reaction of a tetraholosilane of the formula 1: SiX4 with an organohologen compound of the formula 2: RZ , an insulating coating prepared therefrom, semiconductor devices coated therewith, and processes for producing the same. In said formulas, R represents at least monofluorinated alkyl or aryl; and X and Z represent each independently boromine, iodine or chlorine.

32 Claims, 5 Drawing Sheets

FLUORINE-CONTAINING SILICON NETWORK POLYMER, INSULATING COATING THEREOF, AND ELECTRONIC DEVICES THEREWITH

TECHNICAL FIELD

The present invention relates to silicon network polymer containing fluorine in polymer structure, an insulating film and a manufacturing method thereof. Further, the present invention relates to a method of forming a thin film by a photolithography method, using silicon network polymer containing fluorine in polymer structure.

BACKGROUND ART

In the Journal of The Japanese Society of Applied Physics, Volume 34, L452, 1995, there is disclosed silicon network polymer and the synthesizing method thereof. The synthesizing method uses Wurtz's reaction in which trihalosilane is condensation-reacted with sodium metal.

Further, in Japanese Patent Application Laid-Open No. 3-258834 (1991), there is disclosed straight chain fluorine-containing polysilane and the synthesizing method thereof. This also uses Wultz's reaction.

However, in the prior art, fluorine-containing silicon network polymer has never been synthesized. The reason is that the compounds which can be used for the Wurtz's reaction are limited, and in particular there is no raw material for the fluorine-containing silicon network polymer.

In electronic devices, typically a semiconductor, it is extremely desired to obtain an insulating layer with lower permittivity in order to improve its performance. In order to respond the above-mentioned requirement, there has been studied a plasma TEOS film by a CVD method, a SiOF film, etc. However, in order to form those films, it is necessary to provide a CVD equipment, and further the productivity is low. From such a point of view, prior art uses a coating method to form the insulating layer.

In the Journals of The Japanese Society of Applied Physics, Volume 77, 2796 (1995) and Volume 34, L452 (1995), there are disclosed methods of forming a SiO film by using silicon network polymer. However, because the silicon network polymer containing no fluorine is used, it is impossible to obtain the desired insulating layer with lower permittivity.

Further, because the stability of the straight chain fluorine-containing polysilane is low, it is impossible to form the desired insulating layer even if the methods disclosed in the Journals of Japanese Society of Applied Physics, Volume 77, 2796 (1995) and Volume 34, L452 (1995) are applied.

While organic spin-on-glass (hereinafter, abbreviated as SOG), one of polysiloxane type coating material can provide the insulating layer with relatively low permittivity, the stress is large when hardened. It is impossible to form the desired insulating layer except the insulating layer with thickness of sub-micron order. Further, the workability is low and thus it is apt to crack.

As the semiconductor is highly integrated, the irradiation light of far shorter wave is required for use of photolithography in order to obtain fine wires. While in the photolithography g-line (436 nm), one of the emission characteristics of a mercury lamp was commonly used, recently i-line (365 nm) more suitable to fine working has become more used. The fine working is carried out by using photo resist of which a major component is organic macromolecules containing aromatic ring within its molecules. In the development process of forming patterns, a wet development method due to solvent or a dry etching method due to reactive gas is used.

It seems that the microstructures of semiconductors will be further improved. However, previously the photo resist of which a major component is organic material is not suitable for the lithography which uses the light with wavelength shorter than 350 nm in which it has the self-absorption action against the wavelength shorter than 350 nm.

As main light sources of which the wavelength is equal to or less than 350 nm, there are far-ultraviolet or excimer laser such as KrF (248 nm) or Ar (193 nm). The spotlight centers on the photolithography in which the combination of the light source with short wavelength and polysilane of which sensitivity falls within the short wavelength area are used. However, a pattern forming method which uses these polysilane resist also utilizes a wet development method or a dry etching method in which reactive gas is used. (see SPIE, Vol.1466, P211 (1991))

Further, in order to form active elements such as transistors, diodes, etc. on the substrate of a semiconductor, it is necessary to perform more complicated processes such as oxidation reaction, impurity diffusion, ion implantation, etc. in addition to the above-mentioned wiring forming process.

In addition, in order to form light wave-guiding passage, etc., it is necessary to pass through furthermore complicated processes such as etching, coating, etc. Accordingly, there are many problems in the efficiency of manufacturing, the yields, etc.

DISCLOSURE OF INVENTION

An object of the present invention is to provide a new fluorine-containing silicone network polymer, an insulating film of the polymer and a manufacturing method thereof.

Another object of the present invention is to provide an electronic device such as an integrated circuit which the insulating film of the polymer is used, a semiconductor, etc. and a manufacturing method thereof.

Large amounts of organic solvent are used in the wet etching for the pattern forming. Further, because the resolution at the edge of a pattern is small, it is very difficult to form fine patterns. In addition, because it is necessary to use special-purpose and expensive equipment in order to perform the dry etching, the throughput is deteriorated.

Particularly with regard to the resist of which a major component is polysilane, it is possible to perform the photo lithography by using the short wave less than 350 nm. However, since large amounts of organic solvent such as xylene or toluene are used in the wet-etching, and these solvents are flammable and extremely poisonous, it is very difficult to industrialize.

Further, As to materials of a silicone system, typically $SiO_2$, it is required to use, for example, CVD equipment to form an $SiO_2$ film. Therefore, there is a problem in productivity. In order to solve the problem, it can use paint type materials of a siloxane system called spin-on-glass (hereinafter, abbreviated as SOG). However, because with regard to SOG, the stress when hardened is large, it is impossible to form such a film with thickness more than a sub-micron order. Further, the SOG is fragile and it is difficult to work the SOG.

Accordingly, a further object of the present invention is to provide a pattern forming method in which it is possible to form a fine pattern with efficiency and with safety, by using the shorter wave less than 350 nm.

A further object of the present invention is to provide a method of forming a conductive (SiC), a semi-conductive (a-Si), a insulating (SiO), or a light transmissive (SiO$_2$) thin film, materials for an insulating film of which the film characteristics and the workability are improved by using the thin film forming method, a semiconductor device in which the film materials are used, and a method thereof.

The above-mentioned problems are solved by using the following materials, films, semiconductor devices and methods.

(1) A fluorine-containing silicon network polymer represented by the following general formula, having molecular weight of 1,000 to 100,000.

(where, R is aromatic group or alkyl group containing at least one fluorine, and n is integer.)

(2) A fluorine-containing silicon network polymer consisting of the reactant of tetrahalosilane of chemical formula 1 and organohalogenide of chemical formula 2.

(where, R is aromatic group or alkyl group containing at least one fluorine, X is bromine, iodine, chlorine, Z is bromine, iodine, chlorine, and X and Z can be different materials to each other.)

(3) An insulating film comprised of the fluorine-containing silicon network polymer.

The fluorine-containing silicon network polymer can be obtained by inserting a pair of electrodes one of which is a magnesium electrode into mixed solution of the tetrahalosilane of chemical formula 1 and the organohalogenide of chemical formula 2, applying a voltage between the pair of electrodes to react, and coating the reacted solution on the substrate to form a thin film.

It should be appreciated that the thin film can be thermally treated at 200° C. to 1,000° C., in the presence of oxygen.

Further, it should be appreciated that an electromagnetic wave can be irradiated on the thin film in the presence of oxygen.

Furthermore, it should be appreciated that an electromagnetic wave can be irradiated on the thin film in the presence of oxygen, and then the thin film can be thermally treated at 200° C. to 1,000° C., in the presence of oxygen.

It is possible directly to form the thin film on the electronic device by coating.

The fluorine-containing silicon network polymer which has never been obtained in the prior art can be obtained by reacting the tetrahalosilane and the organohalogenide in the presence of the magnesium electrodes. The insulating film with low permittivity and having the improved characteristics can be provided by using the new polymer.

The advantages of the above reaction are in that the range of applications of the reaction is very broad and the yield is very high.

Next, a synthetic method will be explained.

Firstly, organohalogenide reacted with fluorine is reacted with magnesium to produce Grignard reagent. The produced Grignard reagent and tetrahalosilane are reacted with each other to produce trihaloorganosilane. Finally, the desired fluorosilicon network polymer is obtained by the condensation of the triholoorganosilane. Accordingly, instead of the above-mentioned fluoroorganohalogenide, it is possible to use any materials which can produce Grignard reagent, such as fluorohaloallyl, fluorohaloalkyl, etc.

Further, the yield of the produced polymer is higher than that due to the Wurtz's reaction. An R content of the polymer can be adjusted by changing the ratio of SiX$_4$ to RZ.

The synthesis of polysilane having fluoroalkyl group is disclosed in Japanese Patent Application Laid-Open No. 3-258834 (1991). However, it relates to straight chain polysilane, and thus it is different from the present invention.

By using the method described in the Journal of The Japan Society of Applied Physics, Volume 77, 2796 (1995), it is possible to make an oxidation film by the produced fluorosilicon network polymer and to perform the patterning. The relative permittivity of the oxidation film obtained is lower than that due to the conventional silicon network polymer. It is, therefore, more advantageous to improve the performance of electronic devices.

The film obtained by oxidizing the fluorosilicon network polymer is small in film stress, and thus it is suitable to use as an insulating layer for semiconductors.

(4) A method of forming a thin film wherein after forming a thin film of silicon network polymer on a substrate at least one of the following steps are carried out: (a) irradiating an electromagnetic wave to the film of the silicon network polymer in the presence of oxygen, (b) thermally treating the film of silicon network polymer at 200° C. to 1,000° C. in the presence of oxygen.

(5) A method of forming a thin film which comprises the steps of: forming a thin film of silicon network polymer on a substrate; irradiating an electromagnetic wave to the film of the silicon network polymer; thermally treating the film of silicon network polymer at 200° C. to 1,000° C.

(6) A method of forming a thin film wherein the silicon network polymer is made by the polymerization of organic metal compound represented by the following formulas 3 and/or 4.

(Where, R$_1$, R$_2$, R$_3$ are aromatic group, fluoroaliphatic group, or aliphatic group in which the carbon number is equal to or less than 10, and they may be different from one another or the same as others)

(7) A method of forming a thin film according to the above-mentioned paragraph (6), wherein the silicon network polymer is made by reacting and polymerizing organic metal compound represented by the following formulas 3 and/or 4 with at least one of alloy of alkali metals, copper and magnesium.

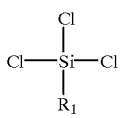

(3)

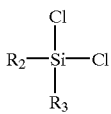

(4)

(Where, $R_1$, $R_2$, $R_3$ are aromatic group, fluoroaliphatic group, or aliphatic group in which the carbon number is equal to or less than 10, and they may be different from one another or the same as others)

(8) An electrically insulating thin film made by irradiating an electromagnetic wave to the film of the silicon network polymer in the presence of oxygen, thermally treating the thin film of silicon network polymer at 200° C. to 1,000° C. in the presence of oxygen.

(9) A method of forming an electrically insulating thin film which comprises the steps of: forming a thin film of silicon network polymer on a substrate, irradiating an electromagnetic wave to the film of the silicon network polymer in the presence of oxygen, and then thermally treating the thin film of silicon network polymer at 200° C. to 1,000° C. in the presence of oxygen.

(10) A semiconductor device which uses the insulating layer as an inter-layer insulating film, made by forming a thin film of silicon network polymer on a substrate, irradiating an electromagnetic wave to the film of the silicon network polymer in the presence of oxygen, and then thermally treating the thin film of silicon network polymer at 200° C. to 1000° C. in the presence of oxygen.

(11) A method of manufacturing a semiconductor device which uses an insulating layer as an inter-layer insulating film, made by forming a thin film of silicon network polymer on a substrate, irradiating an electromagnetic wave to the thin film of the silicon network polymer in the presence of oxygen, and then thermally treating the film of silicon network polymer at 200° C. to 1,000° C. in the presence of oxygen.

(12) A semiconductor device which uses the insulating layer flatten by a chemical machinery polishing method as an inter-layer insulating film, in which the insulating layer is made by forming a thin film of silicon network polymer on a substrate, irradiating an electromagnetic wave to the thin film of the silicon network polymer in the presence of oxygen, and then thermally treating the thin film of silicon network polymer at 200° C. to 1,000° C. in the presence of oxygen.

(13) A method of manufacturing a semiconductor device which comprises a step of flattening the insulating layer by a chemical machinery polishing method, prepared by irradiating an electromagnetic wave to the thin film of the silicon network polymer formed on a substrate in the presence of oxygen, and then thermally treating the film of silicon network polymer at 200° C. to 1,000° C. in the presence of oxygen.

(14) A semiconductor device which uses the insulating layer as a conductive layer and/or a semi-conductive layer, prepared by forming a thin film of silicon network polymer on a substrate, irradiating an electromagnetic wave to the film of the silicon network polymer in the presence of oxygen, and then thermally treating the thin film of silicon network polymer at 200° C. to 1000° C. in the presence of oxygen.

(15) A method of manufacturing a semiconductor device wherein the insulating layer is used as a conductive layer and/or a semi-conductive layer, made by forming a thin film of silicon network polymer on a substrate, irradiating an electromagnetic wave to the film of the silicon network polymer in the presence of oxygen, and then thermally treating the thin film of silicon network polymer at 200° C. to 1,000° C. in the presence of oxygen.

The feature of the present invention is in that fine patterns are formed by performing the irradiation of an electromagnetic wave and the heat treatment using the material of which characteristics, for example, in thermal resistance is changed by the irradiation of the electromagnetic wave, without performing the wet etching or the dry etching as carried out in the prior art. It is, further, possible to form a useful thin film by using only heat treatment without irradiating the electromagnetic wave. In case that network polysilane having fluoroalkyl group is used, characteristics advantageous to improve the characteristics of a high speed electronic device, because the dielectric constant of the insulating film obtained becomes low. While the synthesis of the polysilane having fluoroalkyl group is disclosed in Japanese Patent Application Laid-Open No. 3-258834, the disclosure concerns straight chain polysilane, and thus it is impossible to form fine patterns like the present invention. In order to change the thermal resistance of a thin film by irradiating an electromagnetic wave, it is necessary to use the silicon network polymer according to the present invention in which photooxidation reaction, photobridge reaction, photodecomposition reaction, etc., can be occurred.

The operation of the present invention will be explained hereinafter, taking as an example of the photooxidation-bridging reaction of silicon network polymer.

Silicon network polymer resolved into organic solvent such as toluene are painted and dried on the substrate on which patterns are formed by using a spin coating or dipping method to form a thin film with even thickness. Next, an electromagnetic wave with wavelengths of 150 nm to 350 nm is irradiated onto the thin film of silicon network polymer in the presence of oxygen. Si—Si bonding of the polysilane structure in the thin film of silicon network polymer is cut out at an irradiated area, and bonds to oxygen to produce the structure containing many SiO skeletons. In this process, the silicon network polymer of the present invention takes oxygen into its molecular structure to expand in volume.

Then, the polymer is thermally treated at 200° C. to 1,000° C. in a vacuum. The thin film of silicon network polymer at an unexposed area is decomposed and volatilized from the substrate, or is thermally decomposed to become a semi-conductive thin film such as SiC, amorphous Si, etc. Because the silicon network polymer is thermally stable at a heating temperature less than 200° C., it is not decomposed and converted into SiO, amorphous Si, etc.

Because at the exposed area the SiO with high thermal resistance has been already formed, the SiO area remains on the substrate even after the heat treatment. As a result, the negative pattern is formed. If the temperature of the heat treatment for the substrate is more than 1,000° C., the SiO skeleton portion at the exposed area also is volatilized. Therefore, no film remains on the substrate.

The inventors applied the same exposing and heating process as above to straight chain polysilane. As a result, there was no polysilane film on the substrate at both the exposed area and the unexposed area, after the heat treatment. The reason lies in that the thermal resistance of straight chain polysilane is low.

The heat stability of the silicon network polymer of the present invention can be controlled by changing the formula ratio of the organic metal compound represented by the formulas 1 and 2 in polymerization reaction. As the formula ratio is increased, the heat stability becomes high. If it is necessary to form no fine pattern, it is possible to abbreviated the exposure process. Even if the silicon network polymer formed by abbreviating the exposure process is thermally treated at 200° C. to 1,000° C. in the presence of oxygen, an insulating film of which the characteristic of electricity is excellent. Further, by oxydizing silicon network polymer without heating it, irradiating light to it in the presence of oxygen, it is possible to obtain an insulating film having an improved characteristic in electricity. If necessary, both the photoreaction and the thermal reaction can be used or either of them can be used. The volume expansion due to oxidation reaction can be controlled according to the stage of the process of the photo-oxidation reaction and the thermal oxidation reaction and according to the stage of the process of the thermal decomposition reaction of the organic group. Finally, it is possible to eliminate the volume expansion of the thin film or occur the volumetric shrinkage.

In case that the formed thin film is applied to a semiconductor device, a mechanical characteristic of the thin film becomes very important. If the film to be formed is shrunken in the process of forming, the tensile stress is generated. Therefore, the formed film is fragile and is apt to crack due to a small external force. While, If the film to be formed is expanded in the process of forming, the compression stress is generated. It is, therefore, hard to crack and extremely advantageous to work the film.

Because the film containing many SiO skeletons according to the present invention can control the volume expansion and the film stress generated as described above, it is optimum to use in the manufacturing process of a semiconductor device. It is desirable that in order to prevent a thin film from cracking, it needs to expand the film in the process of forming, or suppress the amount of shrinkage to the minimum amount. Because the thin film of silicon network polymer according to the present invention is excellent in a coating characteristic and a film characteristic, the thickness of the film to be formed is not limited. If a thin film is formed by using spin coating, it is easiest to obtain a thin film with even thickness of 0.1 $\mu$m to 1.0 $\mu$m.

BEST MORD FOR CARRING OUT THE INVENTION

Embodiments of the present invention will be explained (Embodiment 1)

Tetrahydrafuran solution, 200 ml, of 0.4 mol of tetrachrolosilane and 0.4 mol of pentafluorobromobenzene was dropped into a nitrogen-converted flask provided with a magnesium operation electrode and a pair of nickel electrodes by using a dropping funnel, with ice-cooling. The Grignard reaction of tetrachrolosilane and pentafluorobromobenzene was performed under the circulating flow of solvent.

Reaction was performed at 0° C. during 3 hours, with electric potential scanning at 50 mV/sec between −3 V and 0 V applied between the electrodes. The reacted solution is poured into methanol of 100 ml, and re-precipitated and refined by using distilled water of 500 ml. The yield was 51.3%.

The average molecular weight of polystylene conversion measured by GPC was 14,240.

Figure 1:
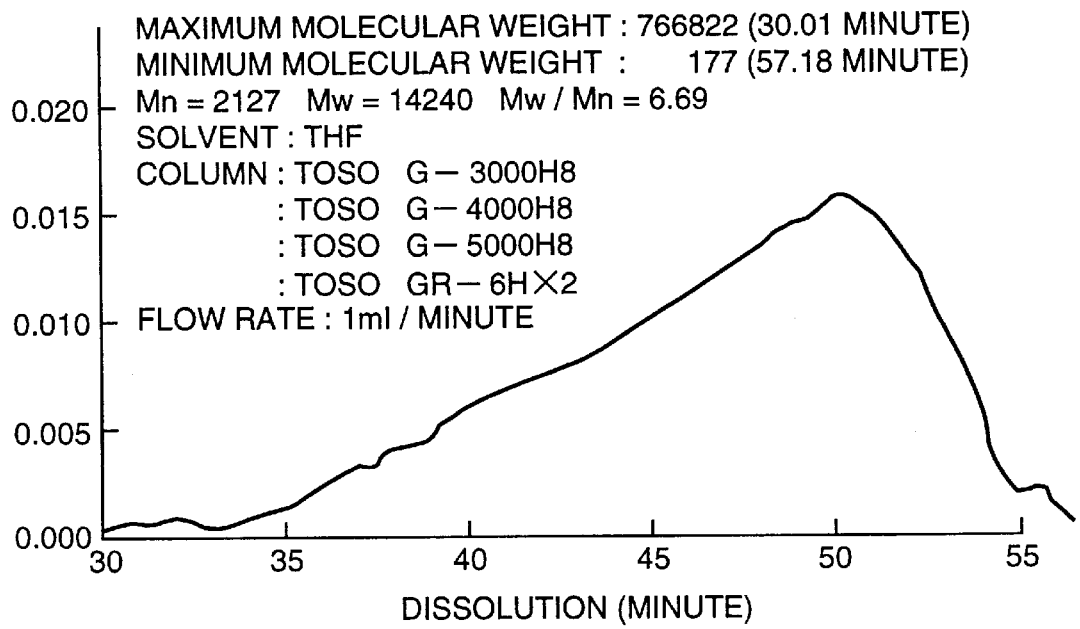
FIG. 1 is a GPC chart of poly (pentafluorophenylsilane) according to the present invention.
Figure 2:
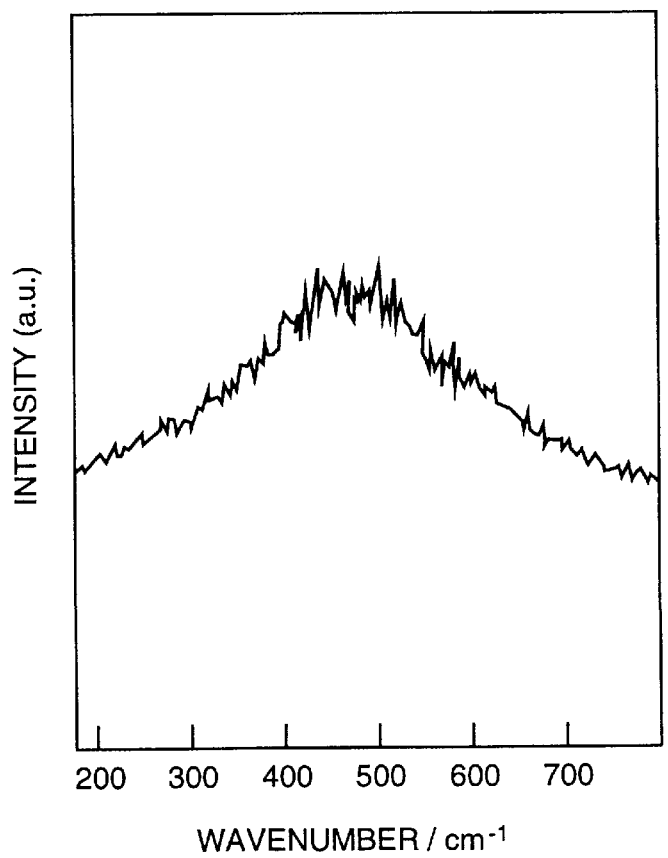
FIG. 2 is a view of Raman spectrum of poly (pentafluorophenylsilane) according to the present invention.

FIG. 1 shows a GPC chart of the obtained poly (pentafluorophenylsilane), and FIG. 2 shows Raman spectrum of the polymer. It is understood that the spectrum of Si—Si bond is broad and networked. The ACS Symposium Series 579,408 (1994) discloses that the vibration spectrum of the networked polysilane becomes broad.

Figure 3:
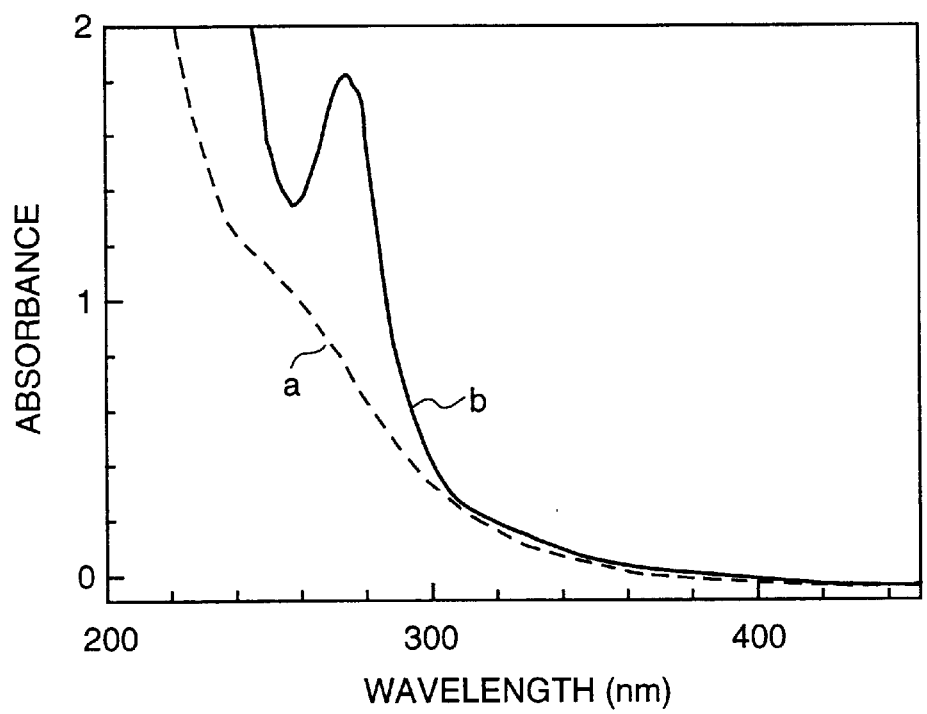
FIG. 3 is a view of visible ultraviolet absorption spectrum of poly (pentafluorophenylsilane) according to the present invention.

FIG. 3 shows a visible ultraviolet absorption spectrum of the obtained polymer. The absorption due to pentafluorophenyl group appears in the neighborhood of 270 nm. In FIG. 3, graph a shows 1 m mol/l THF solution of poly (pentasilane), and graph b shows 1 m mol/l THF solution of poly (pentafluorophenylsilane).

Further, Table 1 shows the result of measurement of XPS (X-ray Photoelectron Spectroscopy) the obtained polymer. Signals indicative of fluorine, oxygen and carbon are observed. It is, therefore, understood that the desired network polymer is obtained. Where, it seems that the observed oxygen atom is introduced by the reaction with methanol when the reaction is stopped.

TABLE 1

| ATOM | (ORBIT) | RELATIVE INTENSITY |
|---|---|---|
| F | (1s) | 21.66 |
| Si | (2p) | 6.20 |
| C | (1S) | 61.29 |
| O | (1s) | 10.85 |

(Embodiment 2)

Pentafluorobromobenzene is changed for nonafluoroiodobutane, and the synthesis is carried out in the same way as Embodiment 1. As a result, poly (nonafluorobutylsilane) was obtained with the yield of 55%.

(Embodiment 3)

Pentafluorobromobenzene is changed for heptafluoroiodopropane, and the synthesis is carried out in the same way as Embodiment 1. As a result, poly (heptafluoropropylsilane) was obtained with the yield of 50%.

(Embodiment 4)

Toluene solution of 20 wt % of the poly (pentafluorophenylsilane) obtained in Embodiment 1 was spin-coated on a silicon wafer. After exposing it for 10 minutes by using 500 W mercury lamp in the presence of oxygen, the thermal treatment is carried out for 1 hour at 500° C. in a vacuum. As a result, an insulating thin film with thickness of 1.5 μm was obtained.

We observed the insulating film by using a microscope and confirmed that there is no crack due to the shrinkage of a thin film in the process of heating, and that the formed film is very fine and uniform. The dielectric constant of the film was 2.7, measured by using frequency of 1 kHz.
(Embodiment 5)

Toluene solution of 20 wt % of the poly (heptafluoropropylsilane) obtained in Embodiment 3 was spin-coated on a silicon wafer. After exposing it for 10 minutes by using 500 W mercury lamp in the presence of oxygen, the thermal treatment was carried out for 1 hour at 400° C. in a vacuum. As a result, an insulating thin film with thickness of 1.5 μm was obtained.

We observed the insulating film by using a microscope and confirmed that there is no crack due to the shrinkage of a thin film in the process of heating, and that the formed film is very fine and uniform. The dielectric constant of the film was 2.5, measured by using frequency of 1 kHz.
(Embodiment 6)

Toluene solution of 30 wt % of the poly (pentafluorophenylsilane) obtained in Embodiment 1 was spin-coated on a silicon wafer on which an aluminum pattern (L/S=1 μm and 1 μm high) is formed, to form a film with thickness of 2 μm. After thermally treating the film for 1 hour at 400° C. in an air, it was flattened in its surface by using a CMP (Chemical Machinery Polishing) method.

There is no crack due to the polishing, and that the formed insulating film is very strong. The withstand voltage was 700 V/μm, and the dielectric constant was 2.5.

Figure 4:
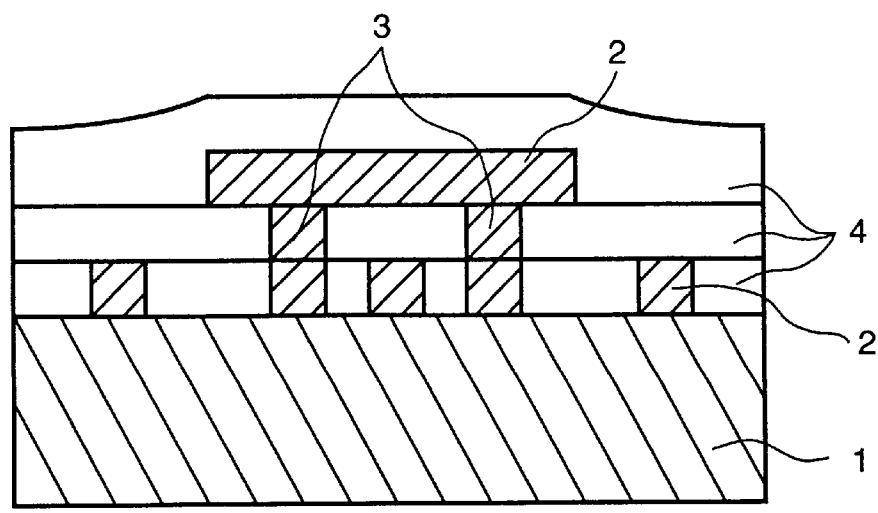
FIG. 4 is a sectional view of an aluminum double-layer-wiring substrate formed on a silicon wafer.

FIG. 4 is a sectional view of an aluminum double-layer-wiring substrate obtained by repeating the above-mentioned process.

Aluminum wiring 2 and aluminum pier 3 are formed by normally etching the aluminum deposited by using a sputtering method. By forming the insulating film 4 on the silicon wafer 1 on which active areas are formed, it is possible to obtain an integrated circuit with high speed response.
(Embodiment 7)

After dropping the solution produced by dissolving 40 m mol of trichrolophenylsilane (phenyl group is used instead of $R_1$ in formula 3) to 5 ml of toluene, into the solution produced by adding 90 m mol of metallic sodium to 4o ml of toluene heated to 110° C. and agitating and distributing it, the reaction is carried out for 1 hour. After cooling the reacted solution, supernatant liquid obtained by eliminating insoluble matters using a centrifugal separator is dropped into excessive methanol, and re-precipitated and refined to obtain poly (phenylsilane). 20 wt % of toluene solution of poly (phenylsilane) was spin-coated on a substrate. After exposing it through a mask pattern for 10 minutes by using 500 W mercury lamp in the presence of oxygen, the thermal treatment was carried out for 1 hour at 700° C. in a vacuum. As a result, a negative pattern with the minimum L/S (line and space)=0.75 μm was formed (the thickness of the film is 1.5 μm) at both the exposed area and the unexposed area. We observed the negative pattern by using a microscope and confirmed that there is no crack due to the shrinkage of a thin film in the process of heating, and that the formed film is very fine and uniform.

Figure 5:
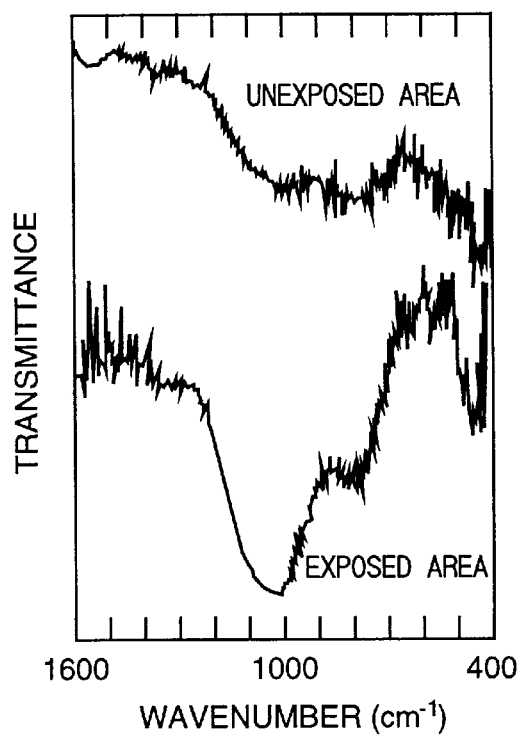
FIG. 5 is a view of infrared transmission spectra at the exposed area and the unexposed area of a poly (phenylsilane) thin film, measured after heating.

FIG. 5 shows infrared transmission spectra at both the exposed area and the unexposed area of the above-mentioned pattern. While at the exposed area a signal of SiO in the neighborhood of 800 $cm^{-1}$ is remarkable, at the unexposed area a signal of SiC in the neighborhood of 800 $cm^{-1}$ is remarkable
(Embodiment 8)

Figure 6:
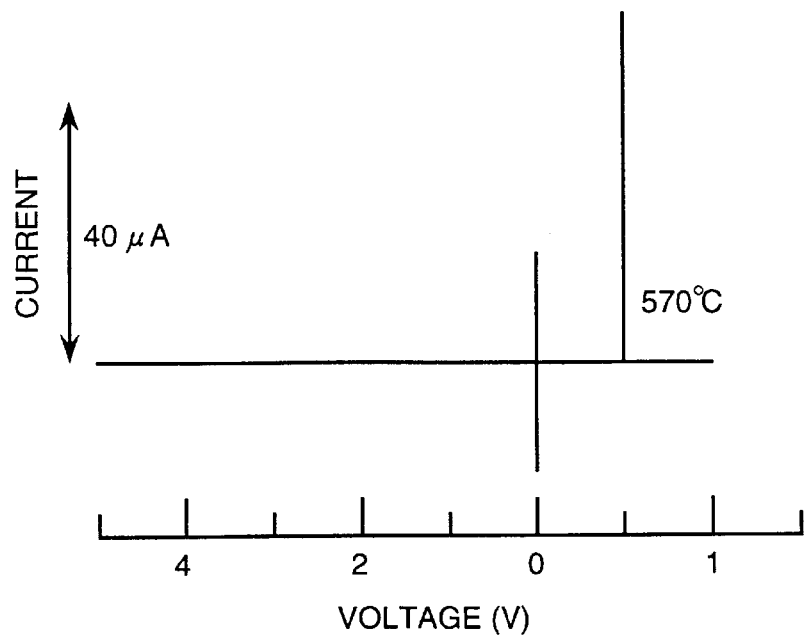
FIG. 6 is a graph showing the current-voltage characteristic of an n-type silicon substrate/SiC thin film.
Figure 7:
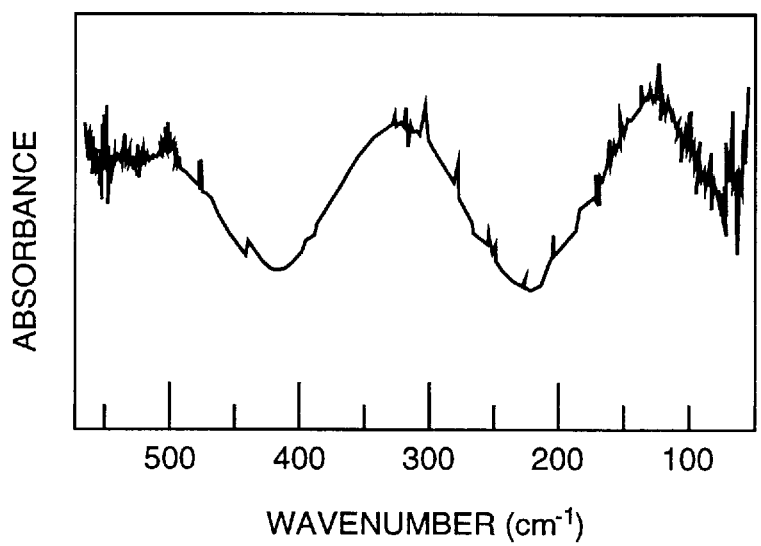
FIG. 7 is a view of far infrared transmission spectrum at the unexposed area of a poly (n-propylsilane) thin film, measured after heating.

An electrode is formed by spin-coating the poly (phenyl silane) in Embodiment 7 on an n-type silicon substrate, thermally treating for 1hour at 700° C. in a vacuum without exposure to light to form an SiC thin film on an n-type silicon substrate, and evaporating gold onto the SiC portion. Further, an indium electrode is formed on an n-type silicon substrate. A bonding characteristic of the n-type silicon substrate/SiC thin film is measured from an electric current/voltage curve obtained at the electrodes. The results of measurement is shown in FIG. 6. by thermal treatment of poly (phenylsilane), hetero-bonding of the n-type silicon substrate and the SiC thin film having a rectifying characteristic was formed easily.
(Embodiment 9)

20 wt % of toluene solution of poly (n-propylsilane) (n-propyl group is used instead of $R_1$ of formula 3) obtained in a way similar to that of Embodiment 7 was spin-coated on a substrate. After exposing it through a mask pattern by using a KrF excimer laser in a vacuum, thermal treatment was carried out for 30 minutes at 350° C. in a vacuum. As a result, a positive pattern with the minimum L/S (line and space)=0.25 μm was formed (the thickness of the film is 0.1 μm) at both the exposed area and the unexposed area. It was seen that an amorphous silicon thin film is formed at the unexposed area from the analysis of the far infrared spectrum shown in FIG. 3.
(Embodiment 10)

After dropping the solution produced by dissolving 8 m mol of trichrolopropylsilane (n-propyl group is used instead of $R_1$ in formula 3) and 32 m mol of dichrolopropylsilane (n-propyl groups were used instead of $R_1$, $R_2$ and $R_3$ in formula 3) to 5 ml of toluene, into the solution produced by adding 90 m mol of metallic sodium to 4o ml of toluene heated to 110° C. and agitating and distributing it, the reaction was carried out for 1 hour. After cooling the reacted solution, supernatant liquid obtained by eliminating insoluble matters using a centrifugal separator was dropped into excessive methanol, and reprecipitated and refined to obtain poly (n-propylsilane). 20 wt % of toluene solution of poly (n-propylsilane) was spin-coated on a substrate. After exposing it through a mask pattern by using the KrF excimer laser in the presence of oxygen, the thermal treatment was carried out for 1 hour at 500° C. in a vacuum.

As a result, a negative pattern of $SiO_2$ with the minimum L/S (line and space)=0.25 gm was formed (the thickness of the film is 1.5 μm) at both the exposed area and the unexposed area. We observed the negative pattern by using a microscope and confirmed that there is no crack due to the shrinkage of a thin film in the process of heating, and that the formed film is very fine and uniform.
(Embodiment 11)

Figure 8:
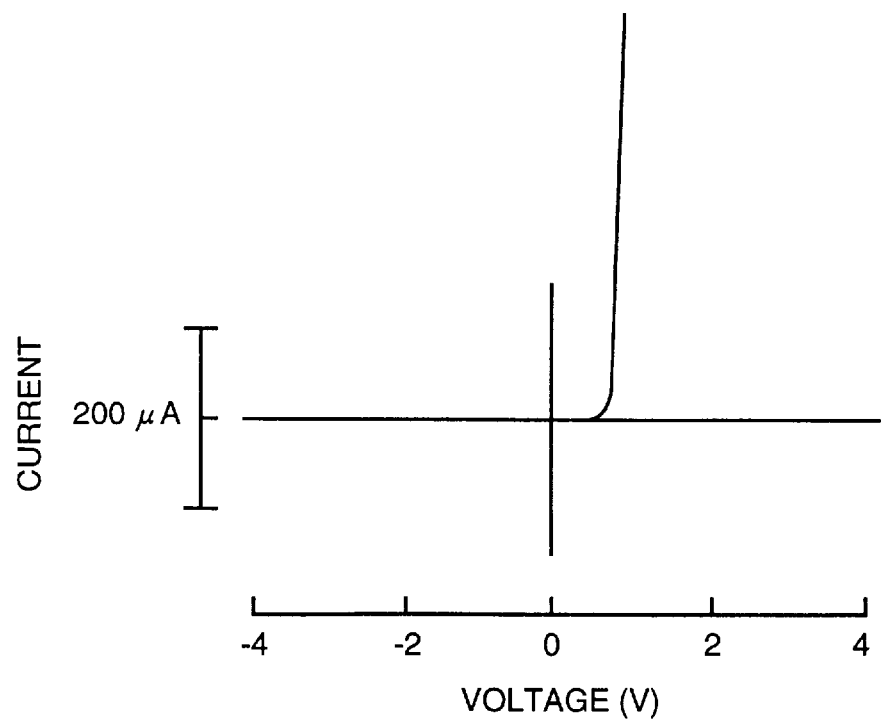
FIG. 8 is a graph showing the current-voltage characteristic of a p-n junction of p-doped amorphous silicon of which the precursor body is an n-type silicon and poly (n-propylsilane).

Toluene solution of 20 wt % of the same poly (n-propylsilane) as one obtained in Embodiment 4 was spin-coated on an n-type silicon substrate to form a poly (n-propylsilane) thin film. By thermally treating the film for 30 minutes at 400° C. in a vacuum, it was converted into an amorphous silicon thin film. By doping phosphorus into the amorphous silicon thin film as the impurity, p-type amorphous silicon thin film was formed. A p-n junction was formed by using the n-type silicon and p-type amorphous silicon thin film, and the characteristic of the junction was measured. The result of measurement is shown in FIG. 8.

(Embodiment 12)

Toluene solution of 30 wt % of the same poly(phenylsilane) as one in Embodiment 7 was spin-coated on a silicon substrate 1 on which an aluminum wiring 2 of L/S=1 μm and 1 μm high is formed, to form a film with thickness of 2 μtm. After thermally treating the film for 1 hour at 400° C. in an air, it was flattened in its surface by using a CMP (Chemical Machinery Polishing) method. There is no crack due to the polishing, and that the formed insulating film 4 is very strong. The withstand voltage for insulation was 600 V/μm, and the dielectric constant was 3.2.

Figure 9:
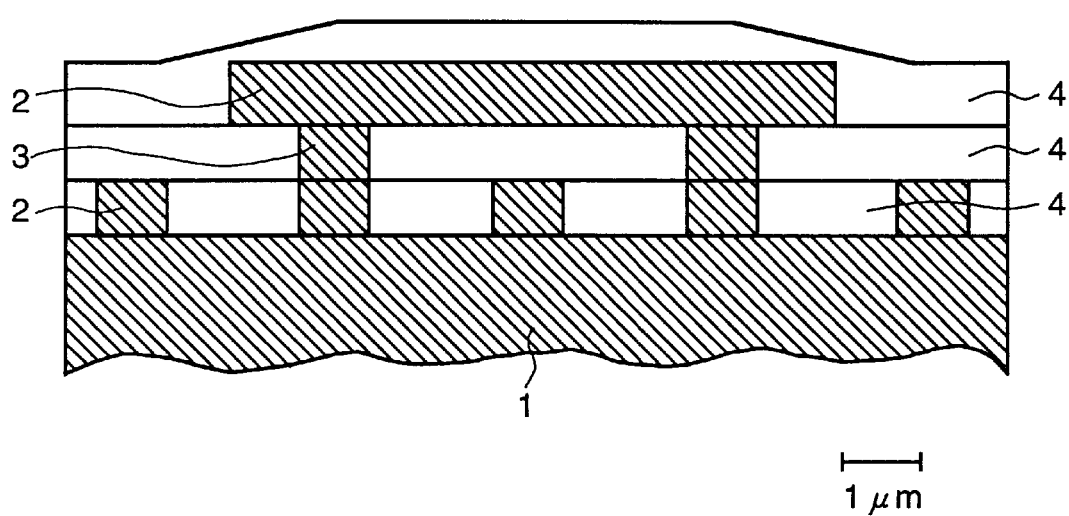
FIG. 9 is a sectional view of an aluminum double-layer-wiring substrate formed on a silicon substrate.

FIG. 9 is a sectional view of an aluminum double-layer-wiring substrate obtained by repeating the above-mentioned process. Aluminum wiring 2 and aluminum pier 3 are formed by normally etching the aluminum deposited by using a sputtering method. By forming the wiring on the silicon substrate on which active areas are formed, it is possible to obtain an integrated circuit.

New fluorosilicon network polymer of the present invention is excellent in a coating characteristic and a film characteristic. It is, therefore, possible to provide an electronic device with high performance and with high speed response by using the polymer as an insulating film for electronic devices.

By irradiating an electromagnetic wave and thermally treating after coating a thin film of polysilane, it is possible to form easily and arbitrarily the thin film having the functions of electrical conductivity (SiC), semi-conductivity (a-Si), insulation (SiO$_2$), light transmission (SiO$_2$), etc. It is, therefore, possible to perform easily the fine work for a semiconductor, etc.

INDUSTRIAL APPLICABILITY

The present invention relates to silicon network polymer containing fluorine in polymer structure, an insulating film and a manufacturing method thereof.

The silicon network polymer containing fluorine in polymer structure is useful for a method of forming a thin film by using a photolithography method, a semiconductor device using the thin film or a method of manufacturing the semiconductor device.

We claim:

1. A fluorine-containing silicon network polymer represented by the following general formula:

where, R is an aromatic group or alkyl group containing at least one fluorine, and n is an integer, the polymer having a molecular weight of 1,000 to 100,000.

2. a fluorine-containing silicon network polymer consisting of the reaction product of tetrahalosilane of chemical formula 1 and organohalogenide of chemical formula 2:

$$SiX_4 \qquad (1)$$

$$RZ \qquad (2)$$

where, R is an aromatic group or alkyl group containing at least one fluorine, X is selected from the group consisting of bromine, iodine and chlorine, Z is selected from the group consisting of bromine, iodine and chlorine, and X and Z can be different materials from each other.

3. An insulating film comprised of fluorine-containing silicon network polymer represented by the following general formula:

where, R is an aromatic group or alkyl group containing at least one fluorine, and n is an integer, said polymer having a molecular weight of 1,000 to 100,000.

4. An insulating film comprised of fluorine-containing silicon network polymer consisting of the reaction product of tetrahalosilane of chemical formula 1 and organohalogenide of chemical formula 2:

$$SiX_4 \qquad (1)$$

$$RZ \qquad (2)$$

where, R is an aromatic group or alkyl group containing at least one fluorine, X is selected from the group consisting of bromine, iodine and chlorine, Z is selected from the group consisting of bromine, iodine and chlorine, and X and Z an be different materials from each other.

5. An insulating film comprised of fluorine-containing silicon network polymer according to claim 3 or 4, wherein said insulating film is one that electromagnetic waves are irradiated in the presence of oxygen.

6. A method of manufacturing fluorine containing silicon network polymer comprising the steps of:

inserting a pair of electrodes one of which is a magnesium electrode into mixed solution of tetrahalosilane of chemical formula 1 and organohalogenide of chemical formula 2:

$$SiX_4 \qquad (1)$$

$$RZ \qquad (2)$$

where, R is an aromatic group or alkyl group containing at least one fluorine, X is selected from the group consisting of bromine, iodine and chlorine, Z is selected from the group consisting of bromine, iodine and chlorine, and X and Z can be different materials from each other, applying a voltage across said pair of electrodes to react the tetrahalosilane and the organohalogenide, so as to form a reacted solution, and coating the reacted solution on a substrate to form a thin film.

7. A method of manufacturing fluorine containing silicon network polymer according to claim 6, wherein the thin film is thermally treated at 200° C. to 1,000° C. in the presence of oxygen.

8. A method of manufacturing fluorine containing silicon network polymer according to claim 6, wherein electromagnetic waves are irradiated on the thin film in the presence of oxygen.

9. A method of manufacturing fluorine containing silicon network polymer according to claim 6, wherein electromagnetic waves are irradiated on the thin film in the presence of oxygen, and then the thin film is thermally treated at 200° C. to 1,000° C. in the presence of oxygen.

10. An electronic device, wherein an insulating layer of a circuit substrate of said electronic device is configured with an insulating film comprised of fluorine-containing silicon network polymer represented by the following general formula:

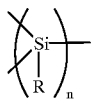

where, R is an aromatic group or alkyl group containing at least one fluorine, and n is an integer, the polymer having a molecular weight of 1,000 to 100,000.

11. A method of forming a thin film, wherein after forming a thin film of silicon network polymer on a substrate at least one of the following steps are carried out: (a) irradiating electromagnetic waves to the film of the silicon network polymer in the presence of oxygen, and (b) thermally treating the film of silicon network polymer at 200° C. to 1,000° C. in the presence of oxygen.

12. A method of forming a thin film which comprises the steps of: forming a thin film of silicon network polymer on a substrate; irradiating electromagnetic waves to the film of the silicon network polymer; and thermally treating the film of silicon network polymer at 200° C. to 1000° C.

13. A method of forming a thin film according to claim 11 or 12, wherein the silicon network polymer is made by the polymerization of organic metal compound represented by the following formulas 3 and/or 4,

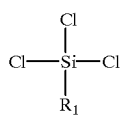

Where, $R_1$, $R_2$, $R_3$, are aromatic group, fluoroaliphatic group, or aliphatic group in which the carbon number is equal to or less than 10, and they may be different from one another or the same as each other.

14. A method of forming a thin film according to claim 13, wherein the silicon network polymer is made by reacting and polymerizing (1) organic metal compound represented by the following formulas 3 and/or 4

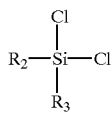

where, $R_1$, $R_2$, $R_3$ are aromatic group, fluoroaliphatic group, or aliphatic group in which the carbon number is equal to or less than 10, and they may be different from one another or the same as each other, with (2) at least one of alloy of alkali metals, copper or magnesium.

15. An electrically insulating thin film made by irradiating electromagnetic waves to the film of the silicon network polymer in the presence of oxygen, and thermally treating the thin film of silicon network polymer at 200° C. to 1000° C. in the presence of oxygen.

16. A method of forming an electrically insulating thin film which comprises the steps of: forming a thin film of silicon network polymer on a substrate, irradiating electromagnetic waves to the film of the silicon network polymer in the presence of oxygen, and then thermally treating the thin film of silicon network polymer at 200° C. to 1,000° C. in the presence of oxygen.

17. A semiconductor device which uses an insulating layer as an inter-layer insulating film, made by forming a thin film of silicon network polymer on a substrate, irradiating electromagnetic waves to the film of the silicon network polymer in the presence of oxygen, and then thermally treating the thin film of silicon network polymer at 200° C. to 1,000° C. in the presence of oxygen.

18. A method of manufacturing a semiconductor device which uses an insulating layer as an inter-layer insulating film, made by forming a thin film of silicon network polymer on a substrate, irradiating electromagnetic waves to the thin film of the silicon network polymer in the presence of oxygen, and then thermally treating the film of silicon network polymer at 200° C. to 1,000° C. in the presence of oxygen.

19. A semiconductor device comprising an insulating layer flattened by a chemical machinery polishing method as an inter-layer insulating film, in which the insulating layer is made by forming a thin film of silicon network polymer on a substrate, irradiating electromagnetic waves to the thin film of the silicon network polymer in the presence of oxygen, and then thermally treating the thin film of silicon network polymer at 200° C. to 1000° C. in the presence of oxygen.

20. A method of manufacturing a semiconductor device which comprises a step of flattening an insulating layer by a chemical machinery polishing method, the insulating layer being made by irradiating electromagnetic waves to the thin film of the silicon network polymer formed on a substrate in the presence of oxygen, and then thermally treating the film of silicon network polymer at 200° C. to 1,000° C. in the presence of oxygen.

21. A semiconductor device which uses the insulating layer as a conductive layer and/or a semi-conductive layer, made by forming a thin film of silicon network polymer on a substrate, irradiating electromagnetic waves to the film of the silicon network polymer in the presence of oxygen, and then thermally treating the thin film of silicon network polymer at 200° C. to 1000° C. in the presence of oxygen.

22. A method of manufacturing a semiconductor device wherein the insulating layer is used as a conductive layer and/or a semi-conductive layer, made by forming a thin film of silicon network polymer on a substrate, irradiating electromagnetic waves to the film of the silicon network polymer in the presence of oxygen, and then thermally treating the thin film of silicon network polymer at 200° C. to 1000° C. in the presence of oxygen.

23. A fluorine-containing silicon network polymer according to claim 1 or 2, wherein said polymer is an amorphous fluorine-containing silicon network polymer.

24. An insulating film according to claim 3 or 4, wherein said polymer is an amorphous fluorine-containing silicon network polymer.

25. An electronic device according to claim 10, wherein said polymer is an amorphous fluorine-containing silicon network polymer.

26. A method of forming a thin film according to claim 11 or 12, wherein the silicon network polymer is a fluorine-containing silicon network polymer.

27. A method of forming a thin film according to claim 13, wherein the silicon network polymer is a fluorine-containing silicon network polymer.

28. A method of forming a thin film according to claim 14, wherein the silicon network polymer is a fluorine-containing silicon network polymer.

29. An electrically insulating thin film according to claim 15, wherein the silicon network polymer is a fluorine-containing silicon network polymer.

30. A method according to claim 16, wherein the silicon network polymer is a fluorine-containing silicon network polymer.

31. A semiconductor device according to claim 17, 19 or 21, wherein the silicon network polymer is a fluorine-containing silicon network polymer.

32. A method of manufacturing a semiconductor device according to claim 18, 20 or 22, wherein the silicon network polymer is a fluorine-containing silicon network polymer.

* * * * *